United States Patent
Cai et al.

(10) Patent No.: US 9,245,979 B2
(45) Date of Patent: Jan. 26, 2016

(54) FINFET SEMICONDUCTOR DEVICES WITH LOCAL ISOLATION FEATURES AND METHODS FOR FABRICATING THE SAME

(71) Applicant: GLOBALFOUNDRIES, Inc., Grand Cayman (KY)

(72) Inventors: Xiuyu Cai, Niskayuna, NY (US); Ruilong Xie, Niskayuna, NY (US); Songkram Srivathanakul, Waterford, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 312 days.

(21) Appl. No.: 13/902,369

(22) Filed: May 24, 2013

(65) Prior Publication Data
US 2014/0346599 A1 Nov. 27, 2014

(51) Int. Cl.
*H01L 29/78* (2006.01)
*H01L 29/66* (2006.01)

(52) U.S. Cl.
CPC ...... *H01L 29/66795* (2013.01); *H01L 29/7851* (2013.01)

(58) Field of Classification Search
CPC .................... H01L 21/266; H01L 29/7843
See application file for complete search history.

(56) References Cited

U.S. PATENT DOCUMENTS

| | | | |
|---|---|---|---|
| 2005/0035391 A1* | 2/2005 | Lee et al. | 257/308 |
| 2006/0057787 A1* | 3/2006 | Doris et al. | 438/153 |
| 2009/0200604 A1* | 8/2009 | Chidambarrao et al. | 257/329 |

* cited by examiner

*Primary Examiner* — Thomas L Dickey
(74) *Attorney, Agent, or Firm* — Ingrassia Fisher & Lorenz, P.C.

(57) ABSTRACT

FinFET semiconductor devices with local isolation features and methods for fabricating such devices are provided. In one embodiment, a method for fabricating a semiconductor device includes providing a semiconductor substrate comprising a plurality of fin structures formed thereon, wherein each of the plurality of fin structures has sidewalls, forming spacers about the sidewalls of the plurality of fin structures, and forming a silicon-containing layer over the semiconductor substrate and in between the plurality of fin structures. The method further includes removing at least a first portion of the silicon-containing layer to form a plurality of void regions while leaving at least a second portion thereof in place and depositing an isolation material in the plurality of void regions.

20 Claims, 9 Drawing Sheets

FINFET SEMICONDUCTOR DEVICES WITH LOCAL ISOLATION FEATURES AND METHODS FOR FABRICATING THE SAME

TECHNICAL FIELD

The present disclosure generally relates to semiconductor devices and methods for fabricating semiconductor devices, and more particularly relates to FinFET semiconductor devices with local electrical isolation features, such as shallow trench isolation features, and methods for fabricating the same.

BACKGROUND

In contrast to traditional planar metal-oxide-semiconductor field-effect transistors (MOSFETs), which are fabricated using conventional lithographic fabrication methods, nonplanar MOSFETs incorporate various vertical transistor structures, and typically include two or more gate structures formed in parallel. One such semiconductor device is the "FinFET," which takes its name from the multiple thin silicon "fins" that are used to form the respective gate channels, and which are typically on the order of tens of nanometers in width.

A FinFET is a type of transistor that lends itself to the dual goals of reducing transistor size while maintaining transistor performance. The FinFET is a three dimensional transistor formed in part in a thin fin that extends upwardly from a semiconductor substrate. Transistor performance, often measured by its transconductance, is proportional to the width of the transistor channel. In a FinFET, the transistor channel is formed along the vertical sidewalls of the fin, so a wide channel, and hence high performance, can be achieved without consuming a relatively large area of the substrate surface required by the transistor.

FinFET semiconductor devices often are fabricated using semiconductor (or silicon) on insulator (SOI) substrates. There are significant advantages, however, to fabricating FinFET semiconductor devices on a bulk semiconductor substrate, including significantly lower cost of fabrication and higher crystalline quality of the bulk semiconductor substrate compared to a SOI substrate. Some problems that are easily solved when using SOI substrates must be addressed when fabricating FinFET semiconductor devices on a bulk semiconductor substrate. One of those problems involves electrical isolation between adjacent fins and between adjacent active areas. When using a SOI substrate, electrical isolation between fins is achieved by etching away all of the semiconductor material between the fins, leaving the fins extending upwardly from the underlying insulating material. Fabrication of FinFET semiconductor devices on bulk semiconductor substrates, however, requires the formation of insulator filled trenches, commonly referred to as shallow trench isolation (STI) features.

As semiconductor devices are scaled smaller and smaller, it becomes more difficult to fabricate the STI features between increasingly narrow trenches. For example, with smaller spacing between fins, the prevalence of "seams" or "voids," which are essentially open spaces in an otherwise continuous material layer, increases as it becomes more difficult to deposit the isolation material between the fins. If the isolation feature contains any such defects, there is a possibility that electrical isolation between transistors may not be provided as desired, potentially resulting in a device failure. Prior art solutions have attempted to employ more "flowable" isolation materials, such as flowable silicon oxides, that are less susceptible to forming seams or voids. However, these flowable materials have an undesirable side effect of causing excess stresses on the fin structures, which can cause fin bending and degraded fin performance.

Accordingly, it is desirable to provide methods for fabricating FinFET integrated circuits on bulk semiconductor substrates that provide the necessary electrical isolation between fin structures. It is further desirable to provide such methods that are not susceptible to fin bending. Furthermore, other desirable features and characteristics of the present disclosure will become apparent from the subsequent detailed description and the appended claims, taken in conjunction with the accompanying drawings and this background.

BRIEF SUMMARY

FinFET semiconductor devices with local isolation features and methods for fabricating such devices are provided. In accordance with an exemplary embodiment of the present disclosure, a method for fabricating a semiconductor device includes providing a semiconductor substrate that includes a plurality of fin structures formed thereon, forming spacers about the sidewalls of the plurality of fin structures, and forming a silicon-containing layer over the semiconductor substrate and in between the plurality of fin structures. The method further includes removing at least a first portion of the silicon-containing layer to form a plurality of void regions while leaving at least a second portion thereof in place and depositing an isolation material in the plurality of void regions.

In accordance with another exemplary embodiment, a method for fabricating a semiconductor device includes providing a semiconductor substrate, depositing and patterning a layer of hard mask material to form a plurality of hard mask lines having substantially uniform pitch and spacing, and anisotropically etching the semiconductor substrate using plurality of hard mask lines as an etch mask to form the plurality of fins. The method further includes forming spacers about sidewalls of the plurality of fin structures, forming an impurity dopant-containing silicon layer over the semiconductor substrate and in between the plurality of fin structures, and forming a silicon layer over the impurity dopant-containing silicon layer and in between the plurality of fin structures. Still further, the method includes removing lateral end portions of the plurality of fin structures, removing at least a first portion of the impurity dopant-containing silicon layer adjacent to the lateral end portions of the plurality of fin structures to form a plurality of void regions while leaving the silicon layer in place, depositing an isolation material in the plurality of void regions, performing a nitridation process on the silicon layer so as to form a silicon nitride layer, and removing at least a portion of the spacers about the sidewalls of the plurality of fins structures and at least a portion of the silicon nitride layer.

In yet another exemplary embodiment, a semiconductor device includes a semiconductor substrate, at least first and second fin structures disposed over the semiconductor substrate, wherein each of the fin structures has sidewalls, sidewall spacers formed on lower portions of the sidewalls of the fins structures, and an isolation layer formed over the semiconductor substrate and in between the sidewall spacers. A height of the sidewall spacers and of the isolation layer above the semiconductor substrate is approximately the same. The semiconductor device further includes a silicon nitride layer formed in between the fin structures and over the sidewall spacers and the isolation layer. A thickness of the sidewall spacers and a height of the silicon nitride layer is approximately the same.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description of the disclosure is merely exemplary in nature and is not intended to limit the disclosure or the application and uses of the disclosure. Furthermore, there is no intention to be bound by any theory presented in the preceding background of the disclosure or the following detailed description of the disclosure.

FinFET semiconductor devices have recently gained interest for use in small-scale integrated circuits, such as those that are scaled at 22 nanometers (nm) and smaller. Techniques known in the prior art for forming FinFET semiconductor devices on bulk semiconductor substrates at these scales typically utilized flowable oxides to prevent the formation of seams of voids during the fabrication of the fin isolation features, which can result in fin bending. Thus, embodiments of the present disclosure described herein provide FinFET semiconductor devices disposed on bulk semiconductor substrates and methods for fabricating the same with electrical isolation features that do not cause fin bending and are not susceptible to having seams or voids form therein.

Figure 1:
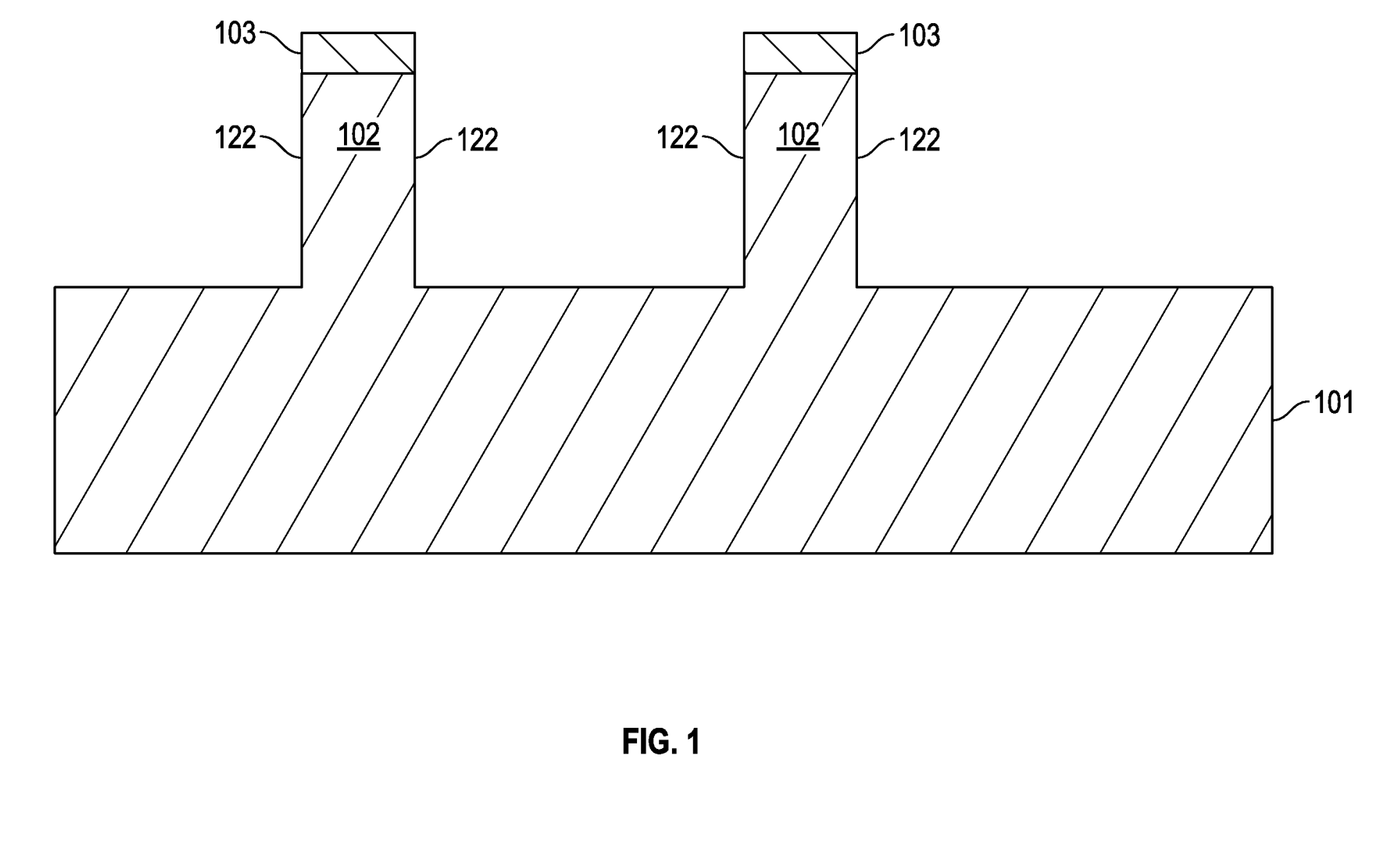
FIGS. 1-4 illustrate, in cross section, a method for fabricating FinFET structures in accordance with various embodiments of the present disclosure.

In one exemplary embodiment, as illustrated in FIG. 1, a method for fabricating a FinFET semiconductor device includes providing a semiconductor substrate that includes a plurality of fin structures or "fins" formed thereon. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. Furthermore, various steps in the manufacture of integrated circuits are well known to those of skill in the art and so, in the interest of brevity, many conventional steps will only be mentioned briefly herein or will be omitted entirely without providing the well-known process details.

FIG. 1 illustrates, in a cut away perspective view, a portion of a FinFET semiconductor device that includes two fins 102 having sidewalls 122 that are formed from and extend upwardly from a bulk semiconductor substrate 101. As discussed above, semiconductor substrate 101 can be any of the semiconductor materials commonly used in the fabrication of integrated circuits, but for ease of discussion but without limitation will be assumed to be a silicon substrate. A hard mask 103 is provided overlying surface of the substrate 101, the hard mask 103 having been formed as a "masking" layer during the etching process used to form the fins 102, as is well-known in the art. In particular, the hard mask 103 is formed by depositing a layer of hard mask material and photolithographically patterning and etching the layer to form a mask having a plurality of lines of substantially uniform pitch and spacing. Hard mask 103 can be, for example, a patterned layer of silicon nitride having a thickness of, for example, about 10 to about 50 nanometers (nm).

The hard mask 103 is used as an etch mask and a plurality of trenches are etched into semiconductor substrate 101 to form a plurality of fins 102 in an array of fins that extend across the semiconductor substrate. The trenches are anisotropically etched, for example by reactive ion etching (RIE) to a depth of, for example, about 40 nm to about 100 nm. Fins 102 can have a width of, for example, about 10 nm to about 20 nm and a pitch of about 20 nm to about 60 nm. Actual trench depth, fin width, and pitch will be determined by the requirements of the circuit being implemented.

Figure 2:
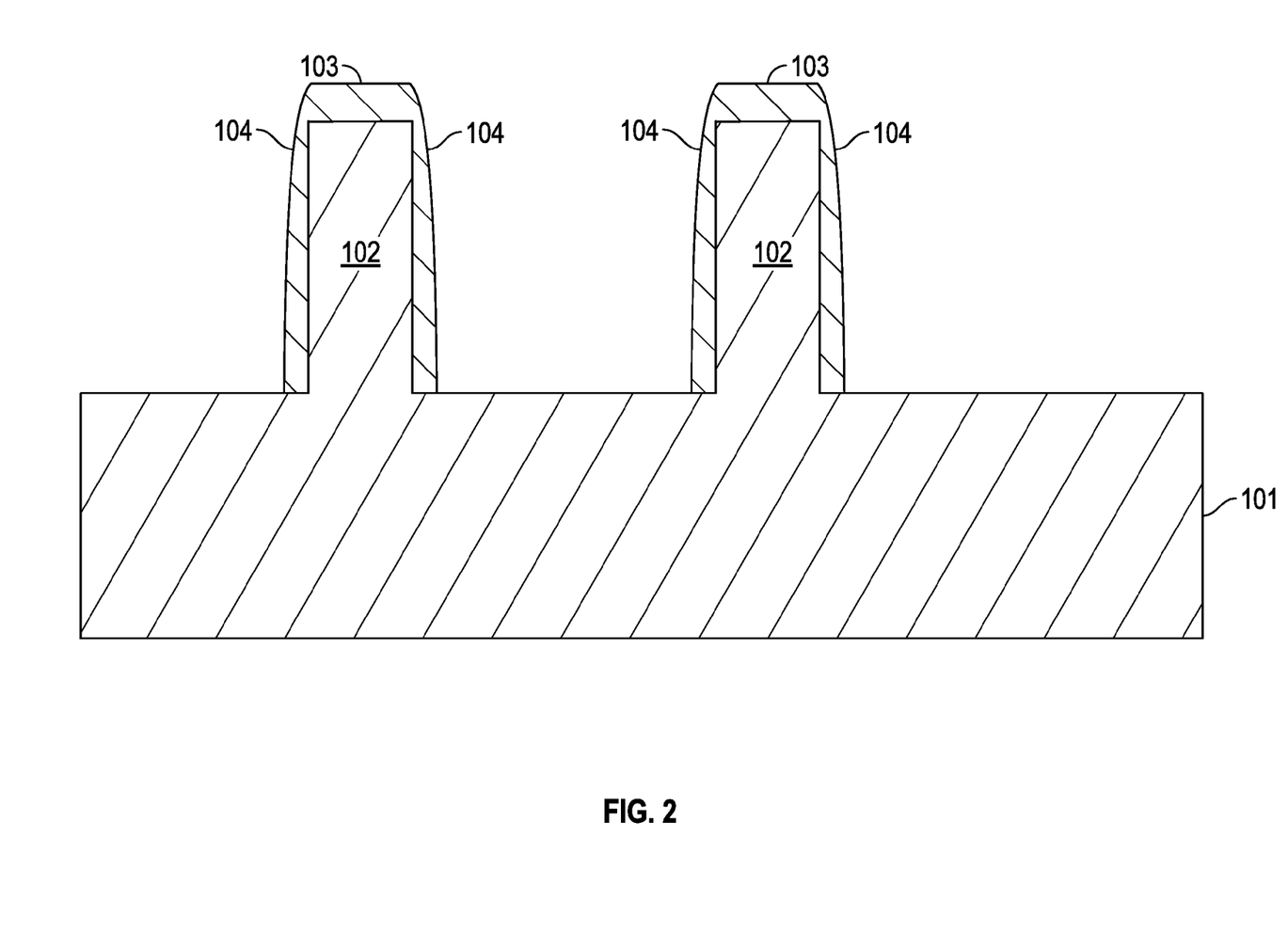

The method for fabricating the FinFET semiconductor device continues with reference to FIG. 2 with the forming of spacers 104 about the sidewalls of the plurality of fins. A spacer-forming material is conformally deposited overlying the fins 102 and within the trenches between the fins 102. In one embodiment, the spacer-forming material is deposited to a thickness in the range of about 15 nm to about 25 nm. In an exemplary embodiment, the spacer-forming material includes a silicon oxide or a silicon nitride. The spacers 104 are formed with an anisotropic etch of the spacer-forming material to form spacers 104 disposed adjacent to the sidewalls 122 of fins 102. The anisotropic etch may be performed by reactive ion etching using a chemistry, such as, for example, a $CH_4$, $CHF_3$, or $CH_2F_2$ chemistry, that etches the spacer-forming material but that is selective to the silicon substrate 101.

Figure 3:
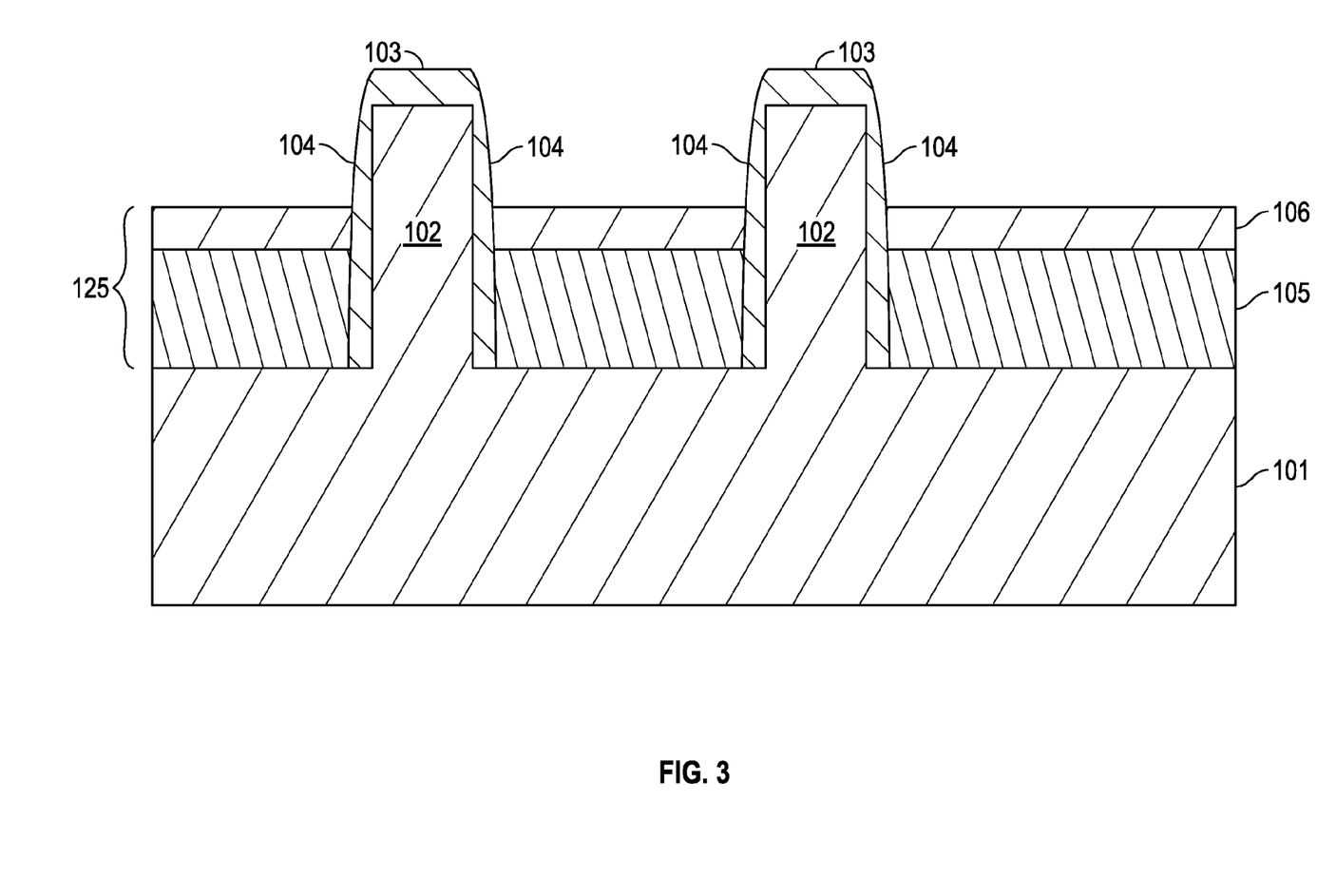

Subsequent to spacer formation, the exemplary method continues in FIG. 3 with forming a silicon-containing material layer 125 over the semiconductor substrate and in between the plurality of fin structures. In some embodiments, the silicon-containing material layer may be formed of one, two, or more individual material layers. For example, in one embodiment, the silicon-containing layer 125 is formed by forming an impurity dopant-containing silicon layer 105 over the semiconductor substrate and in between the plurality of fin structures and then forming a silicon layer 106 over the impurity dopant-containing silicon layer. The layer 105 is formed by epitaxially growing a layer of a different type of semiconductor material on the bulk semiconductor material 101. For example, the impurity dopant-containing silicon layer 105 is realized as silicon germanium (SiGe), which is grown on an exposed surface of the bulk semiconductor material 101 in accordance with epitaxial growth process techniques that are well-known in the art. It should be noted that other materials having the same general properties and characteristics could be used in lieu of silicon germanium. That said, silicon germanium is commonly used for other purposes in semiconductor manufacturing processes, is accepted for use in the industry, and is well-documented. The layer 105 is grown to a thickness of about 10 nm to about 20 nm. As noted above, thereafter, the silicon-containing layer 125 is completed by epitaxially growing a silicon layer 106 over the SiGe layer 105. The layer 105 is grown to a thickness of about 10 nm to about 20 nm. The layer 106 is grown to a thickness of about 10 nm to about 15 nm. As shown, the silicon-containing layer 125 (as shown, layers 105 and 106) does not extend to the full height of the fin structures 102. That is, the silicon-containing layer extends to a height of, for example, at most 35 nm above the substrate 101, whereas the fins 102 were formed, for example, to a height of at minimum 40 nm.

Figure 4:
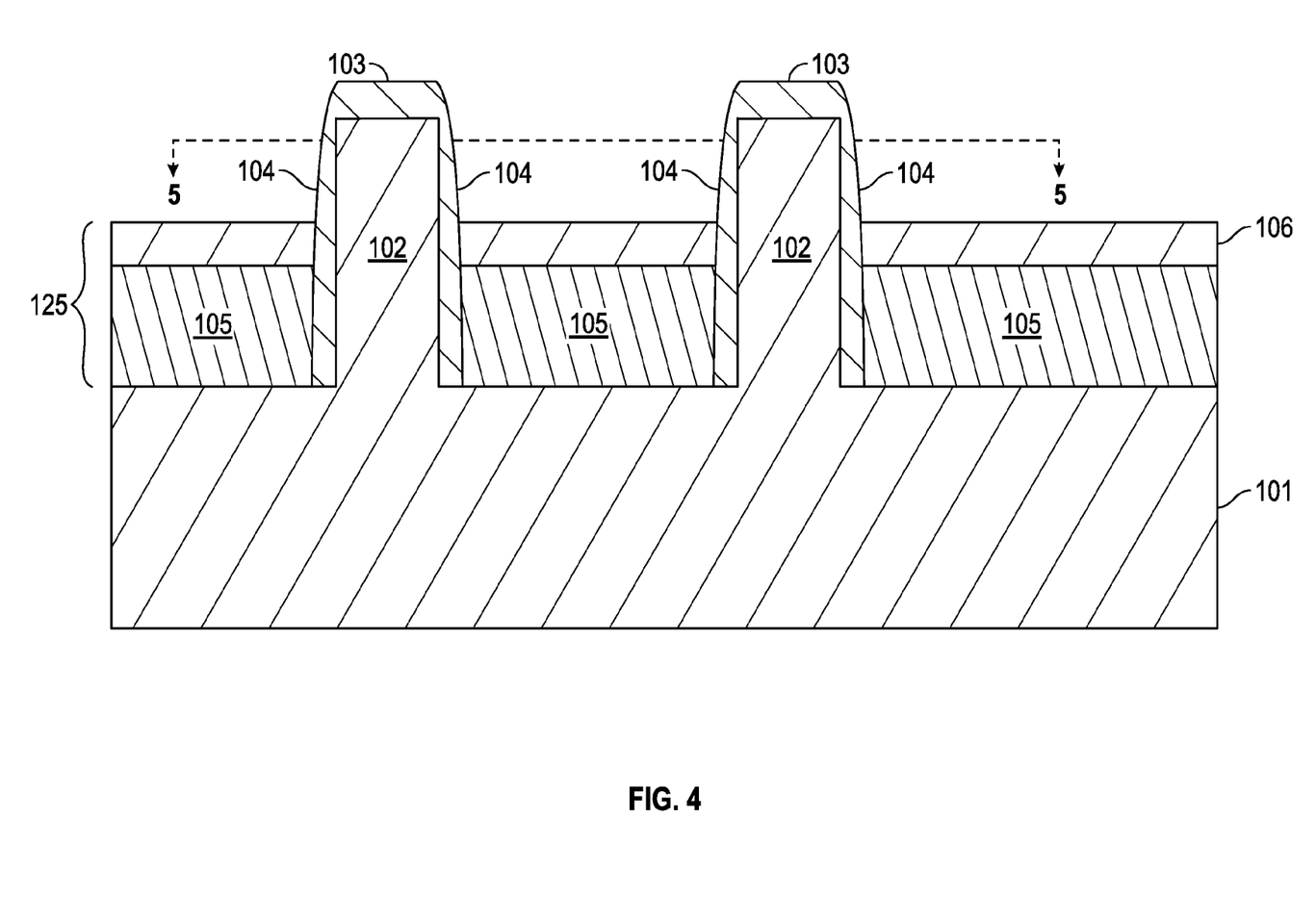
Figure 5:
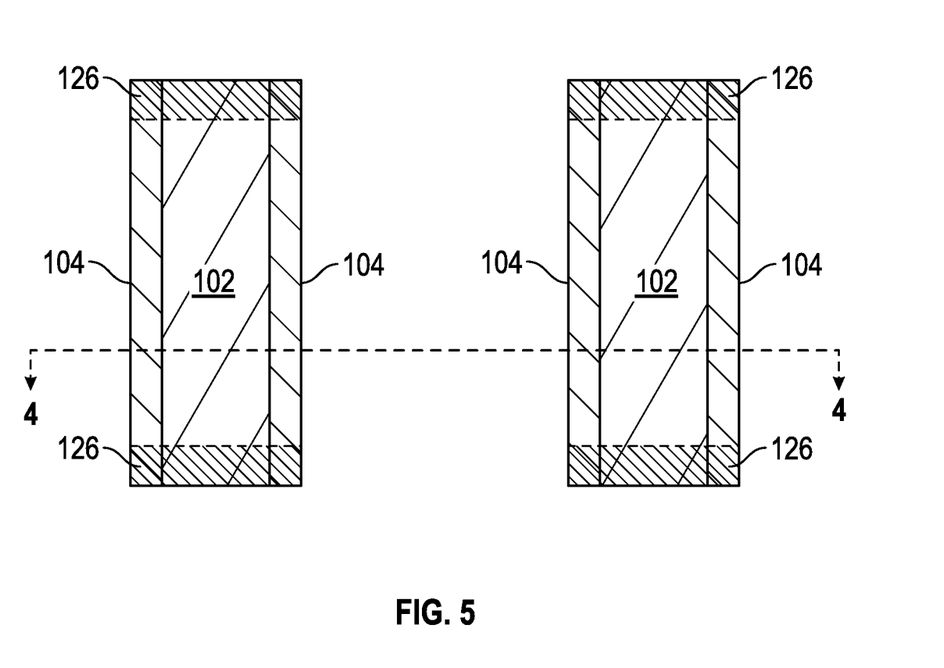
FIG. 5 is a cross-sectional top view of the semiconductor structure of FIG. 4 taken along axis 5-5.

With reference now to FIGS. 4 and 5, the exemplary method continues with removing lateral end portions 126 of the plurality of fin structures 102. FIG. 5 provides a cross-sectional top view through top portions of the fins 102 to illustrate the removed lateral ends 126 (which are illustrated in an overlying diagonal-hatch pattern to shown the portions to be removed). As used herein, the term "lateral end portions" refers to about 5 nm to about 30 nm of the length-wise ends of each fin 102. Any suitable technique may be employed for this step, such as etching and the like, in combination with a suitable patterned mask. The lateral ends 126 are removed to expose lateral portions of the silicon-containing layer, i.e., layers 105 and 106.

Figure 6:
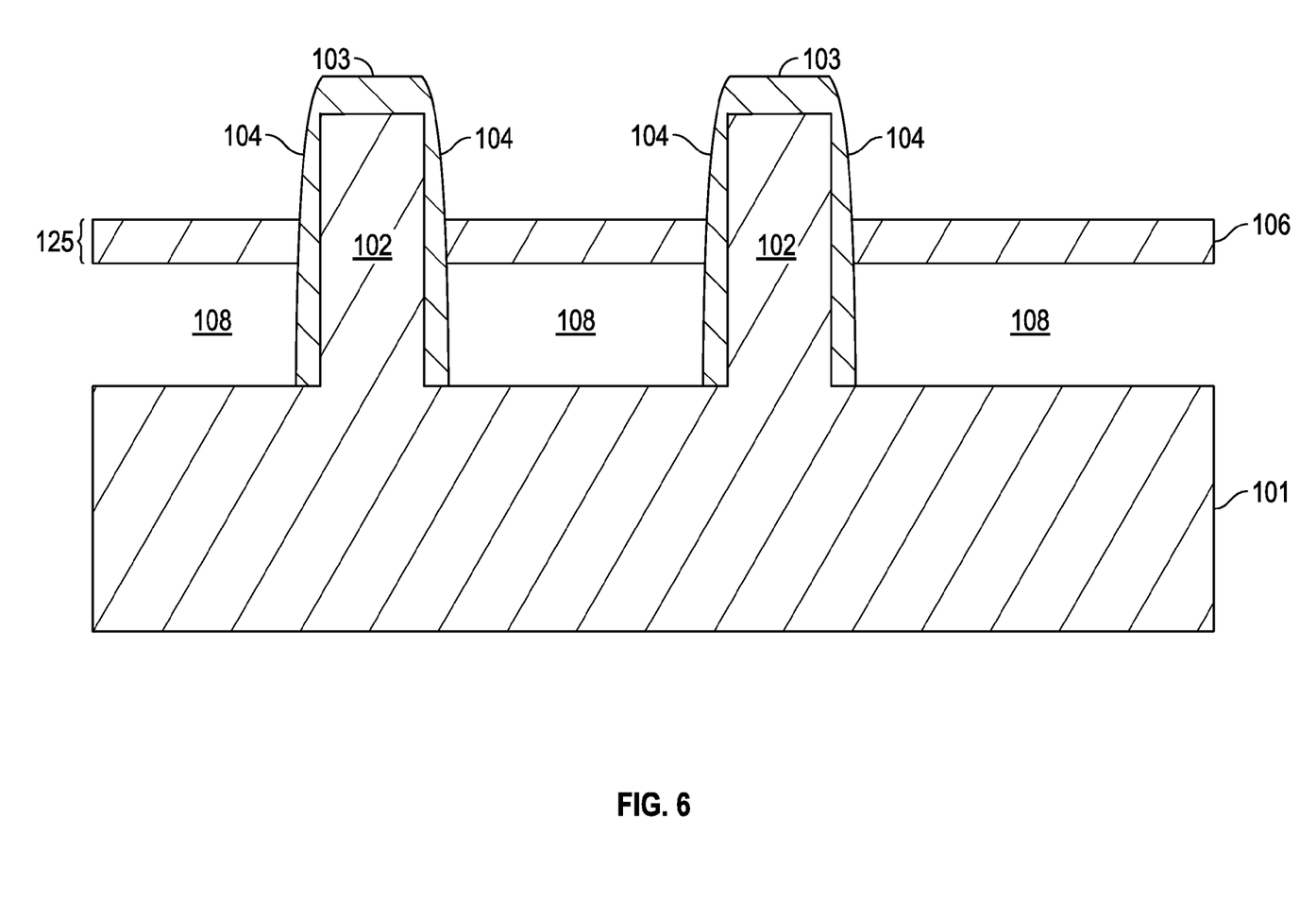
FIGS. 6-9 are cross-sectional views of additional steps of the method for fabricating FinFET structures.

With the lateral sides exposed, the exemplary method continues with reference to FIG. 6 with removing at least a first portion of the silicon-containing layer 125 to form a plurality of void regions 108 while leaving at least a second portion thereof in place. For example, SiGe layer 105 may be removed in areas between the fins 102 with an isotropic etchant that is selective to SiGe, thus leaving layer 106 (and substrate 101, fins 102, and spacers 104) in place. Layer 106 is supported in place by compressive stress from the fins 102, and also by non-removed portions of layer 105 adjacent to the fins 102 (not illustrated). Wet etchants of SiGe typically include an oxidizing agent like $H_2O$ or HNO and a silicon complexing agent like HF or $NH_4OH$. To achieve higher selectivities, etchants are diluted with water, or moderators like acetic acid or phosphoric acids are added. This etching process that is selective to SiGe results in a structure as shown in FIG. 6 with a plurality of void regions 108 formed between the remaining epitaxial silicon layer 106 and the silicon substrate 101.

Figure 7:
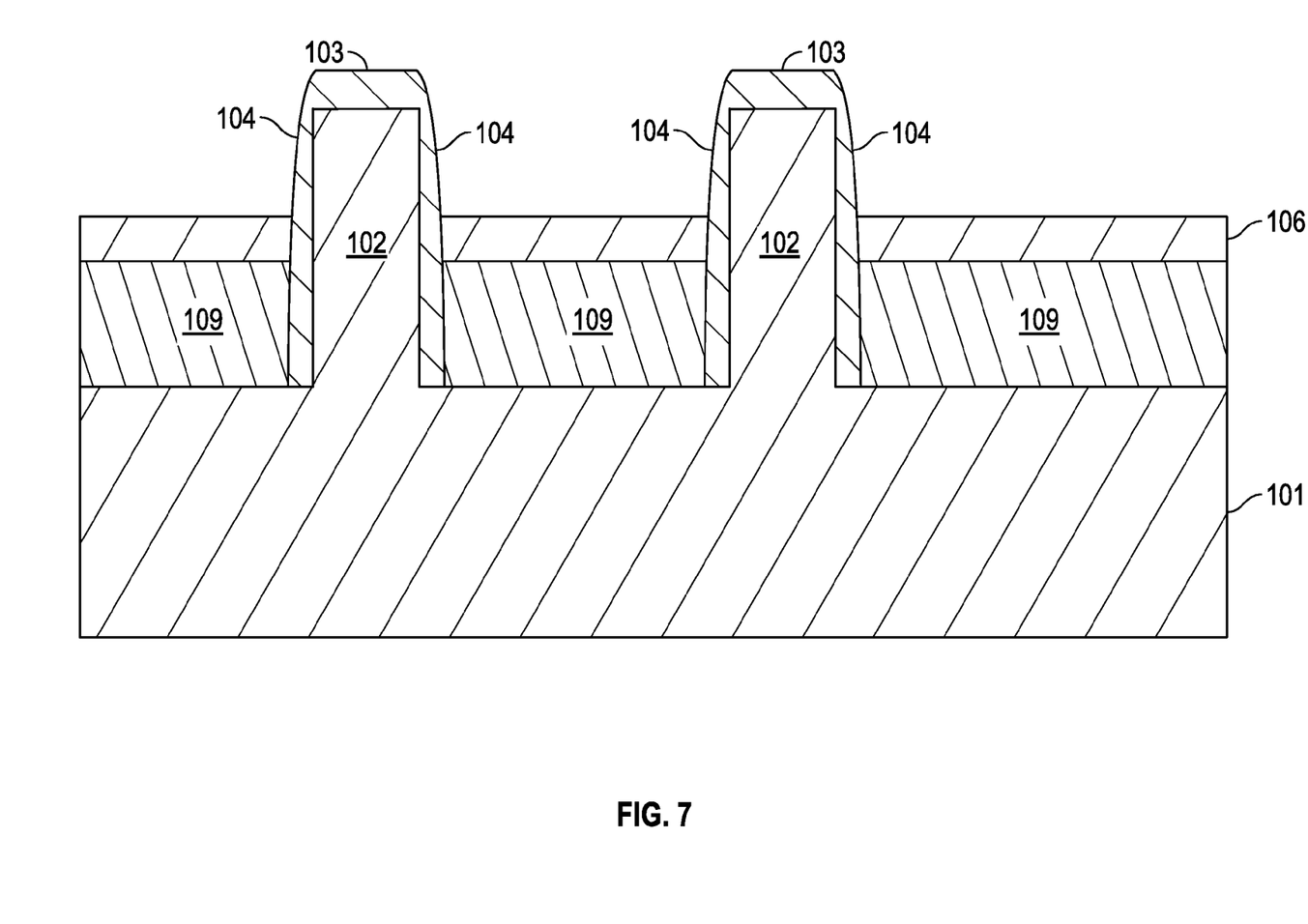

With the addition of the void regions 108, the method for fabricating the FinFET semiconductor device continues with depositing an isolation material in the plurality of void regions 108. In order to fill the topography created by forming the void regions 108, it is desirable to employ an isolation material, such as a silicon oxide, that has good filling properties. In one embodiment, a flowable oxide may be employed for this purpose. The flowable oxide is a material having a flowing property due to relatively low viscosity, such as boron phosphorus silicate glass (BPSG), phosphorus silicate glass (PSG), perhydro-polysilazane (PSZ), or hydrogen silsesquioxane-based flowable oxide (HSQ), which is deposited in fluid-form using a spin-on technique. For example, HSQ has the general composition $(H_2Si_2O_3)_n$, where n is a number from 3 to 8. After initial deposition, the flowable oxide conforms to the underlying contour defined by void regions 108 and forms isolation layer 109, as shown in FIG. 7. The flowable oxide is then heated at a temperature of approximately 400° C. to approximately 800° C. to cure the isolation layer 109.

As noted above, flowable oxides tend to induce excess stresses when they are formed and cured, and as such have the potential to cause fin bending. However, in accordance with the present disclosure, as a portion of the silicon-containing layer was left in place, i.e. epitaxial silicon layer 106, the fins will not deform during the formation of the isolation layer 109 with the flowable oxide due to the "pinning" effect maintained by the epitaxial silicon layer 106 with respect to the fins 102.

In an alternative embodiment, isolation layer 109 may be created using atomic layer deposition (ALD) of an isolation material such as silicon oxide. ALD is accomplished by using gas-phase reactants to build a material layer by molecular transport of the reactants from the gas phase to the solid phase along the desired deposition surface. Gas phase reactants are able to enter within the underlying contour defined by void regions 108 and form isolation layer 109. Here again, the presence of layer 106 prevents any bending of the fins 102.

Regardless of which isolation material is employed to form the isolation layer 109, excess isolation material will be formed and accumulate on the surface of the remaining portion of the silicon-containing layer, i.e. epitaxial silicon layer 106. Thus, a procedure such as chemical etching or polishing is employed to remove the excess isolation material from the surface of layer 106.

Figure 8:
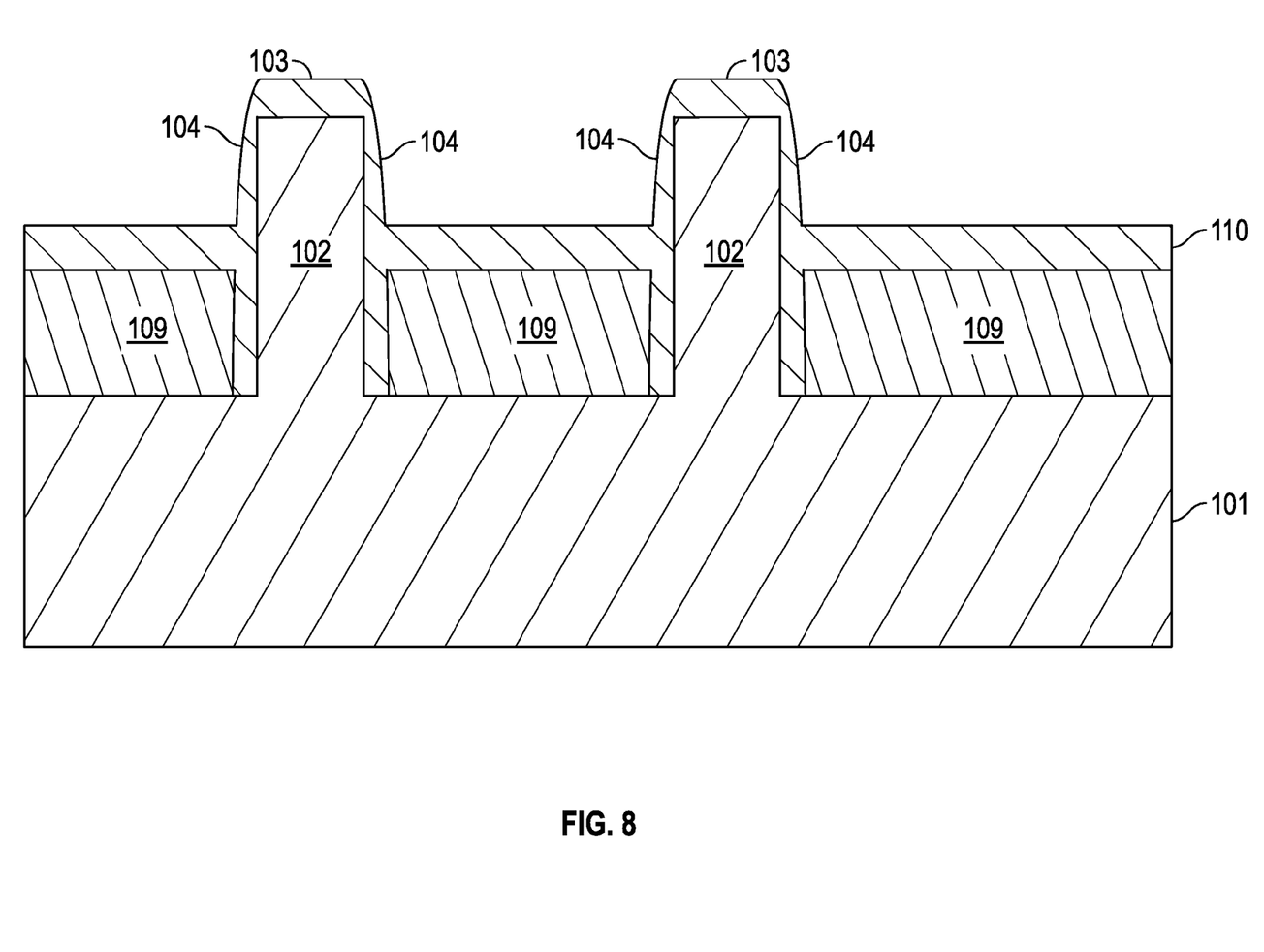

Thereafter, the exemplary method continues as shown in FIG. 8 with performing a nitridation process on the epitaxial silicon layer 106 so as to form a silicon nitride layer, which is illustrated with reference numeral 110. In one embodiment, plasma nitridation may be employed for this process. In this process, the surface of the epitaxial silicon layer 106 is subjected to a nitrogen plasma to form a nitrided silicon layer at the surface of the silicon material. The thickness of the layer of nitrided silicon and the amount of nitrogen incorporated into the silicon are dependent on a number of process parameters as discussed below. The plasma nitriding is accomplished in a plasma reactor generally in the range of about 200° C. to about 500° C. Pressure in the plasma reactor can be maintained, for example, at a pressure from about 1 Torr to about 10 Torr In general any nitrogen source can be used to supply the nitrogen to the plasma. For a high nitrogen content, a mixture of $NH_3$ with nitrogen, helium, or argon or mixtures thereof has been shown to be beneficial. For a medium or low nitrogen content the source gas instead can be nitrogen mixed with helium and/or argon. While other nitridation processes are within the scope of the present disclosure, an advantage of the plasma nitridation to create nitrided silicon layer 110 is that the quality as well as the thickness of the layer can be tuned, as needed for the fabrication process being implemented, in a wide range and with good uniformity across the entire semiconductor substrate.

Figure 9:
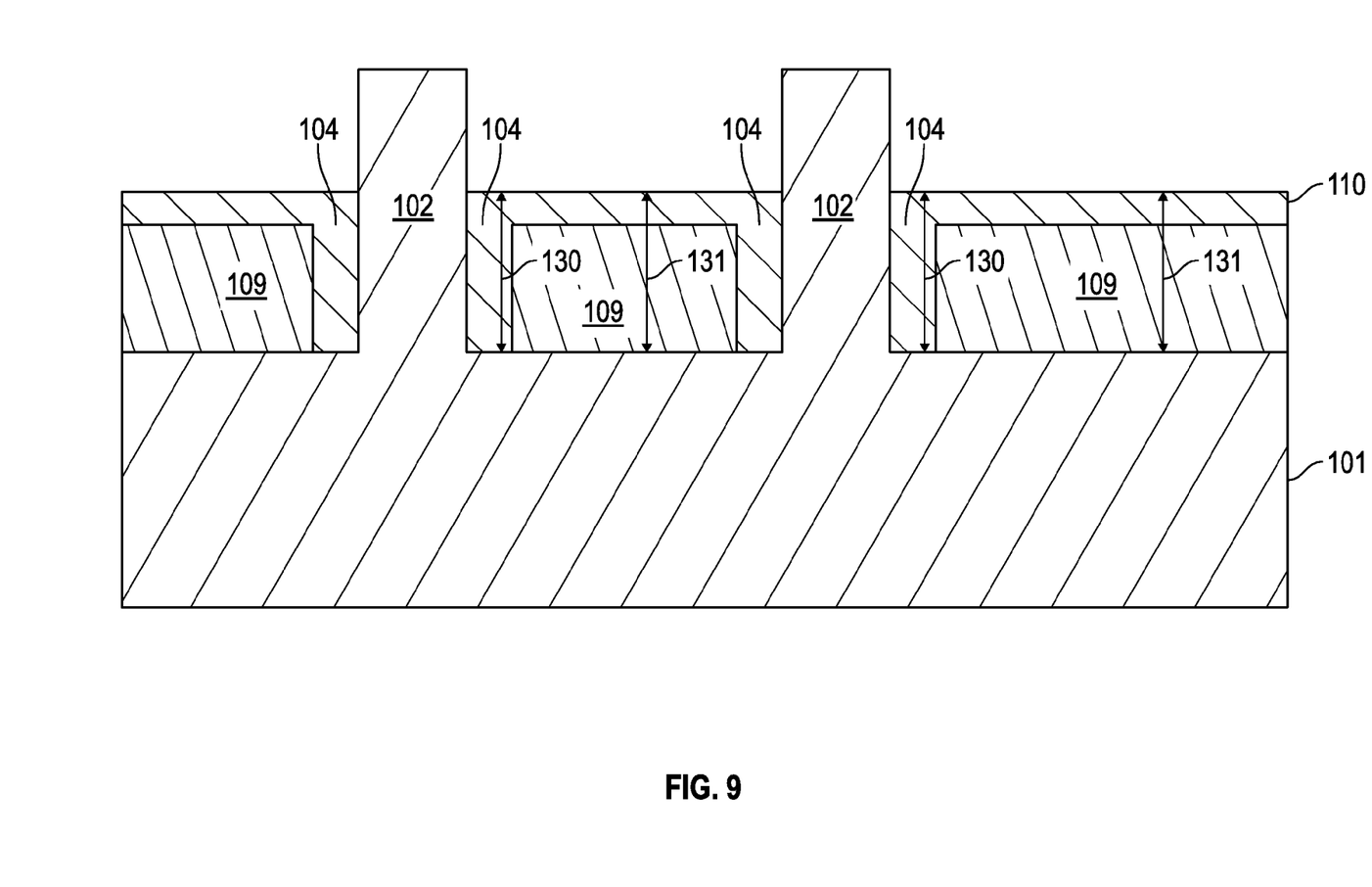

With reference now to FIG. 9, the exemplary method continues with removing at least a portion of the spacers about the sidewalls of the plurality of fins structures and at least a portion of the silicon nitride layer. For example, as shown in FIG. 8, an entirety of the silicon nitride hardmask 103 is removed, and all of the spacers 104 are removed from above a certain height along the fins 102. Further, the silicon nitride layer 110 is reduced in thickness. The reduction of the silicon nitride layer 110 corresponds with the point above which the spacers 104 are removed from the sidewalls of the fins 102. Etching the hardmask 103, the spacers 104, and the silicon nitride layer 110 simultaneous allows this etching process to occur without the need for any additional patterning or etching steps, as would be required if the etching was directed solely at the hardmask 103 and spacers 104. Thus, the remaining portions of the silicon nitride spacers 104 and the remaining portions of the silicon nitride layer 110 form a two-legged silicon nitride feature having a substantially uniform thickness, with the two legs being disposed with respect to one another at substantially a right angle. In other words, the shape of the silicon nitride feature approximates the letter "L". The removal of silicon nitride as disclosed herein is accomplished using an isotropic etch. In an exemplary embodiment, an isotropic plasma etch process is performed using a carbon trifluoride/oxygen/helium ($CHF_3/O_2/He$) plasma. A bias voltage may be applied to tailor the desired mass transport/etching rates along various portions of the semiconductor device to achieve the desired silicon nitride feature shape.

FIG. 8 shows the FinFET structure at the stage of fabrication after all of the isolation structures have been completed. As shown, the FinFET structure includes a semiconductor substrate 101 and at least first and second fin structures 102 disposed over the semiconductor substrate. Sidewall spacers 104 are formed on lower portions of the sidewalls of the fins structures 102. An isolation layer 109 is formed over the semiconductor substrate 101 and in between the sidewall spacers 104. A height 130 of the sidewall spacers 104 and a height 131 of the isolation layer 109 above the semiconductor substrate 101 are approximately the same. The semiconductor device further includes a silicon nitride layer 110 formed in between the fin structures 102 and over the sidewall spacers 104 and the isolation layer 109. A thickness of the sidewall spacers 104 and a thickness of the silicon nitride layer 110 is approximately the same.

Although not illustrated in the Figures, the fins within any of the active areas can be etched to divide the fins into lengths needed to form the FinFETs required to implement the integrated circuit being fabricated. Fabrication of the IC then proceeds in conventional manner to form the necessary transistor elements. For example, gate structures including a gate insulator and a gate electrode are formed overlying fins 102. The gate structures may be formed by either gate first techniques or by replacement gate techniques, both of which are well known to those of skill in the art. Similarly, source and drain regions may be formed by impurity doping portions of the fins in self alignment with the gate structures. The source and drain regions may be formed by ion implantation, plasma doping, or the like. Middle of the line and back end of the line processing may then proceed in the usual manner. The subject matter disclosed herein is not intended to exclude any subsequent processing steps to form and test the completed FinFET semiconductor device as are known in the art.

Accordingly, the various embodiments of the present disclosure provide methods for fabricating semiconductor devices, and in particular portions of FinFET transistors with local electrical isolation regions. The described embodiments are compatible with existing process flows, and do not result in the formation of seams or voids in the isolation regions, or the bending of the fins, as was commonly encountered in the prior art.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure, it being understood that various changes may be made in the function and arrangement of elements described in an exemplary embodiment without departing from the scope of the disclosure as set forth in the appended claims and their legal equivalents.

What is claimed is:

1. A method for fabricating a semiconductor device, the method comprising:
    providing a semiconductor substrate comprising a plurality of fin structures formed thereon, wherein each of the plurality of fin structures has sidewalls;
    forming spacers about the sidewalls of the plurality of fin structures;
    forming a silicon-containing layer over the semiconductor substrate and in between the plurality of fin structures;
    removing at least a first portion of the silicon-containing layer to form a plurality of void regions while leaving at least a second portion thereof in place; and
    depositing an isolation material in the plurality of void regions.

2. The method of claim 1, wherein providing a semiconductor substrate comprises providing a bulk silicon semiconductor substrate.

3. The method of claim 1, wherein forming spacers comprises forming silicon nitride spacers about the sidewalls of the plurality of fin structures.

4. The method of claim 1, wherein forming the silicon-containing layer comprises epitaxially forming an impurity-doped layer over the semiconductor substrate.

5. The method of claim 4, wherein forming the impurity-doped layer comprises epitaxially forming a silicon-germanium layer over the semiconductor substrate.

6. The method of claim 5, wherein forming the silicon-contain layer further comprises epitaxially forming a silicon layer over the epitaxially-formed silicon-germanium layer.

7. The method of claim 6, wherein removing at least a first portion of the silicon-containing layer comprises isotropically etching the epitaxially-forming silicon-germanium layer while leaving the epitaxially-formed silicon layer in place.

8. The method of claim 1, wherein depositing the isolation material comprises depositing a flowable silicon oxide material.

9. The method of claim 1, wherein depositing the isolation material comprises depositing a silicon oxide material using atomic layer deposition (ALD) techniques.

10. The method of claim 1, further comprising performing a nitridation process on the second portion of the silicon-containing layer so as to form a silicon nitride-containing layer.

11. The method of claim 1, further comprising removing at least a portion of the spacers about the sidewalls of the plurality of fins structures and at least a portion of the silicon nitride-containing layer.

12. A method for fabricating a semiconductor device comprising:
    providing a semiconductor substrate;
    depositing and patterning a layer of hard mask material to form a plurality of hard mask lines having substantially uniform pitch and spacing;
    anisotropically etching the semiconductor substrate using the plurality of hard mask lines as an etch mask to form a plurality of fin structures, wherein each of the plurality of fin structures has sidewalls;
    forming spacers about the sidewalls of the plurality of fin structures;
    forming an impurity dopant-containing silicon layer over the semiconductor substrate and in between the plurality of fin structures;
    forming a silicon layer over the impurity dopant-containing silicon layer and in between the plurality of fin structures;
    removing lateral end portions of the plurality of fin structures;
    removing at least a first portion of the impurity dopant-containing silicon layer adjacent to the lateral end portions of the plurality of fin structures to form a plurality of void regions while leaving the silicon layer in place;
    depositing an isolation material in the plurality of void regions;

performing a nitridation process on the silicon layer so as to form a silicon nitride layer; and removing at least a portion of the spacers about the sidewalls of the plurality of fins structures and at least a portion of the silicon nitride layer.

13. The method of claim 12, wherein etching the semiconductor substrate comprises etching the semiconductor substrate to form fin structures having a height of about 40 nm to about 100 nm and a width of about 10 to about 20 nm.

14. The method of claim 12 further comprising:

forming a gate insulator overlying the at least a portion of at least one of the plurality of fins; and forming a gate electrode overlying the gate insulator.

15. The method of claim 14 further comprising impurity doping source and drain regions in the at least a portion of at least one of the plurality of fins in self alignment with the gate electrode.

16. A semiconductor device comprising:

a semiconductor substrate, wherein the semiconductor substrate comprises a bulk silicon substrate;

at least first and second fin structures disposed over the semiconductor substrate, wherein each of the fin structures has sidewalls, wherein the first fin structure, the bulk silicon substrate, and the second fin structure form a continuous and contiguous bulk silicon structure;

sidewall spacers formed on lower portions of the sidewalls of the fins structures;

an isolation material layer formed over the semiconductor substrate and in between the sidewall spacers, wherein the isolation material layer comprises a silicon oxide material, and wherein a height of the sidewall spacers and of the isolation material layer above the semiconductor substrate is approximately the same; and a silicon nitride layer formed in between the fin structures and over the sidewall spacers and the isolation material layer, wherein a thickness of the sidewall spacers and a height of the silicon nitride layer is approximately the same, and wherein each of the first and second fin structures extend to a height above the semiconductor substrate that is above the height of the silicon nitride layer.

17. The semiconductor device of claim 16, wherein the sidewall spacers and the silicon nitride layer form approximately "L-shaped" features.

18. The semiconductor device of claim 16, wherein the fin structures have a height of about 40 nm to about 100 nm and a width of about 10 to about 20 nm, and wherein a combination of the isolation material layer and the silicon nitride layer have a height of no more than about 35 nm above the semiconductor substrate.

19. The semiconductor device of claim 16, further comprising a gate insulation layer disposed over at least a portion of both the first and second fin structures.

20. The semiconductor device of claim 19, further comprising a gate electrode disposed over the gate insulation layer.

* * * * *